(12) United States Patent
Sun et al.

(10) Patent No.: US 7,501,651 B2
(45) Date of Patent: Mar. 10, 2009

(54) TEST STRUCTURE OF SEMICONDUCTOR DEVICE

(75) Inventors: Min-chul Sun, Suwon-si (KR); Ja-hum Ku, Seongnam-si (KR); Brian J. Greene, Yorktown Heights, NY (US); Manfred Eller, Wappingers Falls, NY (US); Roman Knoefler, Fishkill, NY (US); Zhijiong Luo, Carmel, NY (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 375 days.

(21) Appl. No.: 11/243,595

(22) Filed: Oct. 5, 2005

(65) Prior Publication Data

US 2006/0113534 A1 Jun. 1, 2006

Related U.S. Application Data

(60) Provisional application No. 60/631,688, filed on Nov. 30, 2004.

(51) Int. Cl.
*H01L 23/58* (2006.01)

(52) U.S. Cl. ....................................................... 257/48

(58) Field of Classification Search .................. 257/48, 257/327, 328, 377, 382–390, 408, 754–757, 257/E21.521, E21.522, E21.544; 438/17, 438/18

See application file for complete search history.

(56) References Cited

U.S. PATENT DOCUMENTS

| | | | |
|---|---|---|---|
| 5,029,321 A * | 7/1991 | Kimura | 257/243 |
| 5,191,401 A * | 3/1993 | Shirai et al. | 257/328 |
| 5,514,604 A * | 5/1996 | Brown | 438/270 |
| 5,723,376 A * | 3/1998 | Takeuchi et al. | 438/270 |
| 5,811,850 A * | 9/1998 | Smayling et al. | 257/335 |
| 5,883,418 A * | 3/1999 | Kimura | 257/412 |
| 5,913,106 A * | 6/1999 | Hause et al. | 438/18 |
| 5,972,725 A * | 10/1999 | Wollesen et al. | 438/14 |
| 5,994,193 A * | 11/1999 | Gardner et al. | 438/303 |
| 6,081,010 A * | 6/2000 | Sanchez | 257/345 |
| 6,175,136 B1 * | 1/2001 | Okamura | 257/369 |
| 6,262,439 B1 * | 7/2001 | Takeuchi et al. | 257/77 |
| 6,329,253 B1 * | 12/2001 | Song et al. | 438/281 |
| 6,330,697 B1 * | 12/2001 | Clinton et al. | 714/721 |
| 6,350,636 B1 * | 2/2002 | Lee et al. | 438/186 |
| 6,413,822 B2 * | 7/2002 | Williams et al. | 438/270 |
| 6,429,452 B1 * | 8/2002 | Jarvis | 257/48 |
| 6,482,704 B1 * | 11/2002 | Amano et al. | 438/285 |
| 6,489,800 B1 * | 12/2002 | Dallavalle | 324/765 |
| 6,521,910 B1 * | 2/2003 | Lin | 257/48 |

(Continued)

*Primary Examiner*—Ha Tran T Nguyen
*Assistant Examiner*—Ming Hung Hung
(74) *Attorney, Agent, or Firm*—F. Chau & Associates, LLC.

(57) ABSTRACT

A test structure of a semiconductor device with improved test reliability is provided. The test structure includes first and second active regions which are electrically isolated from each other and on which silicided first and second junction regions are formed, respectively, a semiconductor substrate or a well which is formed on lower parts of the first and second junction regions and has a conductivity type different from the first and second junction regions, and first and second pads through which an electrical signal is applied to the first and second junction regions and detected, and which are formed on the same level as a lower part of a metal layer or on the same level as the semiconductor substrate.

24 Claims, 13 Drawing Sheets

U.S. PATENT DOCUMENTS

| | | | |
|---|---|---|---|
| 6,545,302 B2 * | 4/2003 | Han | 257/222 |
| 6,642,076 B1 * | 11/2003 | Yaung et al. | 438/48 |
| 6,804,095 B2 * | 10/2004 | Kunz et al. | 361/56 |
| 6,869,840 B2 * | 3/2005 | Chatterjee et al. | 438/238 |
| 6,914,313 B2 * | 7/2005 | Wang et al. | 257/410 |
| 6,953,972 B2 * | 10/2005 | Yeo et al. | 257/369 |
| 6,977,195 B1 * | 12/2005 | Bush et al. | 438/197 |
| 7,153,770 B2 * | 12/2006 | Choi | 438/653 |
| 7,317,204 B2 * | 1/2008 | Sun et al. | 257/48 |
| 2002/0076876 A1 * | 6/2002 | Ker et al. | 438/218 |
| 2002/0109196 A1 * | 8/2002 | Fujisawa et al. | 257/384 |
| 2002/0140037 A1 * | 10/2002 | Jung | 257/357 |
| 2004/0132268 A1 * | 7/2004 | Koo et al. | 438/583 |
| 2006/0020181 A1 * | 1/2006 | Schmitt | 600/310 |
| 2006/0076558 A1 * | 4/2006 | Morita et al. | 257/48 |

* cited by examiner

TEST STRUCTURE OF SEMICONDUCTOR DEVICE

CROSS REFERENCE TO RELATED APPLICATIONS

This application claims the benefit of U.S. Provisional Application No. 60/631,688 filed Nov. 30, 2004 in the United States Patent and Trademark Office, the disclosure of which is incorporated by reference herein.

BACKGROUND OF THE INVENTION

1. Field of the Invention

The present invention relates to a test structure of a semiconductor device, and more particularly, to a test structure of a semiconductor device with improved test reliability.

2. Description of the Related Art

As semiconductor devices continue to be highly integrated, the sheet resistance and contact resistance of the gate electrodes and source/drain regions of the MOS transistors increase, thereby increasing the resistance-capacitance delay time of the electrical signal that is applied to the gate electrodes of metal oxide semiconductor (MOS) transistors.

Accordingly, to produce high-performance MOS transistors suitable for highly integrated semiconductor devices, a silicide layer is formed on a gate electrode and a source/drain region of a MOS transistor. The silicide layer is usually formed by a self-aligned silicide (salicide) process. However, the silicide layer that is formed on the source/drain region passes through the source/drain region and penetrates down to a semiconductor substrate or a well on a lower part of the source/drain region, thereby resulting in a junction breakdown. This is referred to as silicide spike. In a case where the silicide spike occurs, a junction leakage current is drastically increased. Further, the occurrence of the silicide spike degrades electrical characteristics and reliability of the MOS transistors.

Accordingly, it would be desirable to have a test structure of a semiconductor device that is capable of determining whether silicide spike of silicide has occurred after performing a silicide formation process.

SUMMARY OF THE INVENTION

Disclosed is a test structure of a semiconductor device capable of testing the semiconductor device upon completion of a silicide formation process.

According to an embodiment of the present invention, there is provided a test structure of a semiconductor device including first and second active regions which are electrically isolated from each other and on which silicided first and second junction regions are formed, respectively, a semiconductor substrate or a well which is formed on lower parts of the first and second junction regions and has a conductivity type different from the first and second junction regions, and first and second pads through which an electrical signal is applied to the first and second junction regions and detected, and which are formed on the same level as a lower part of a metal layer or on the same level as the semiconductor substrate.

According to another embodiment of the present invention, there is provided a test structure of a semiconductor device including first and second active regions which are electrically isolated from each other and on which silicided first and second junction regions are formed, respectively, a semiconductor substrate or a well which is formed on lower parts of the first and second junction regions and has a conductivity type different from the first and second junction regions, first and second pads which are formed on the semiconductor substrate and the same level as a lower part of a metal layer, and first and second connecting portions which each connect the first and second pads to the first and second junction regions.

According to still another embodiment of the present invention, there is provided a test structure of a semiconductor device including first and second active regions which are electrically isolated from each other and in which silicided first and second junction regions are formed, respectively, a semiconductor substrate or a well which electrically connects lower parts of the first and second junction regions to each other and has a conductivity type different from the first and second junction regions, and first and second well pads which are formed on a portion of the lower parts of the first and second junction regions and have the same conductivity type as the first and second junction regions.

BRIEF DESCRIPTION OF THE DRAWINGS

The present invention will become more apparent by describing in detail preferred embodiments thereof with reference to the attached drawings in which.

DETAILED DESCRIPTION OF PREFERRED EMBODIMENTS

Figure 1:
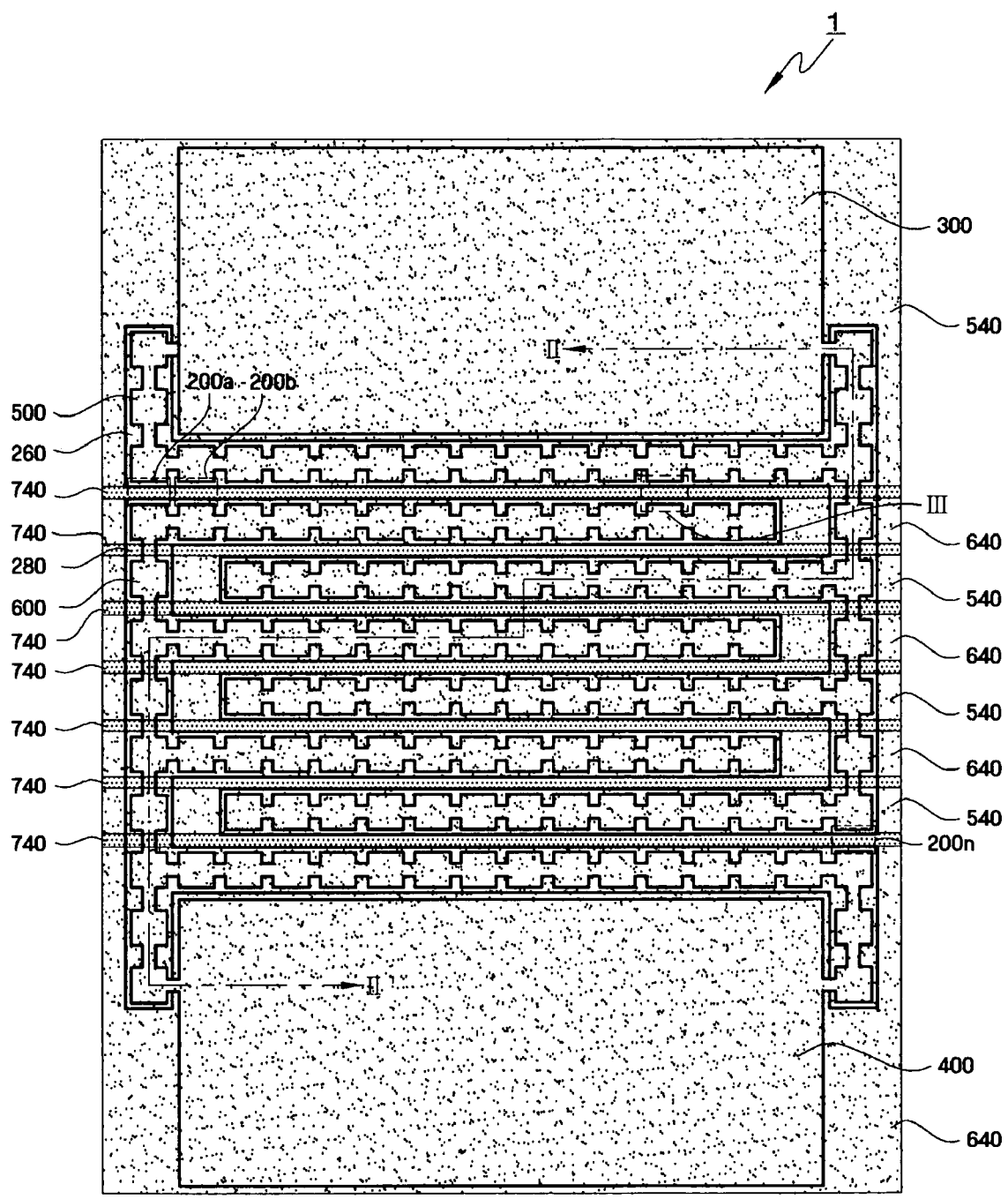
FIG. 1 is a layout diagram of a test structure of a semiconductor device according to one embodiment of the present invention.

The present invention and methods of accomplishing the same may be understood more readily by reference to the following detailed description of preferred embodiments and the accompanying drawings. Like reference numerals refer to like elements throughout the specification.

Hereinafter, a test structure of a semiconductor device including first and second pads formed on the same level as a lower part of a metal layer is described with reference to FIGS. 1 through 7.

Figure 2:
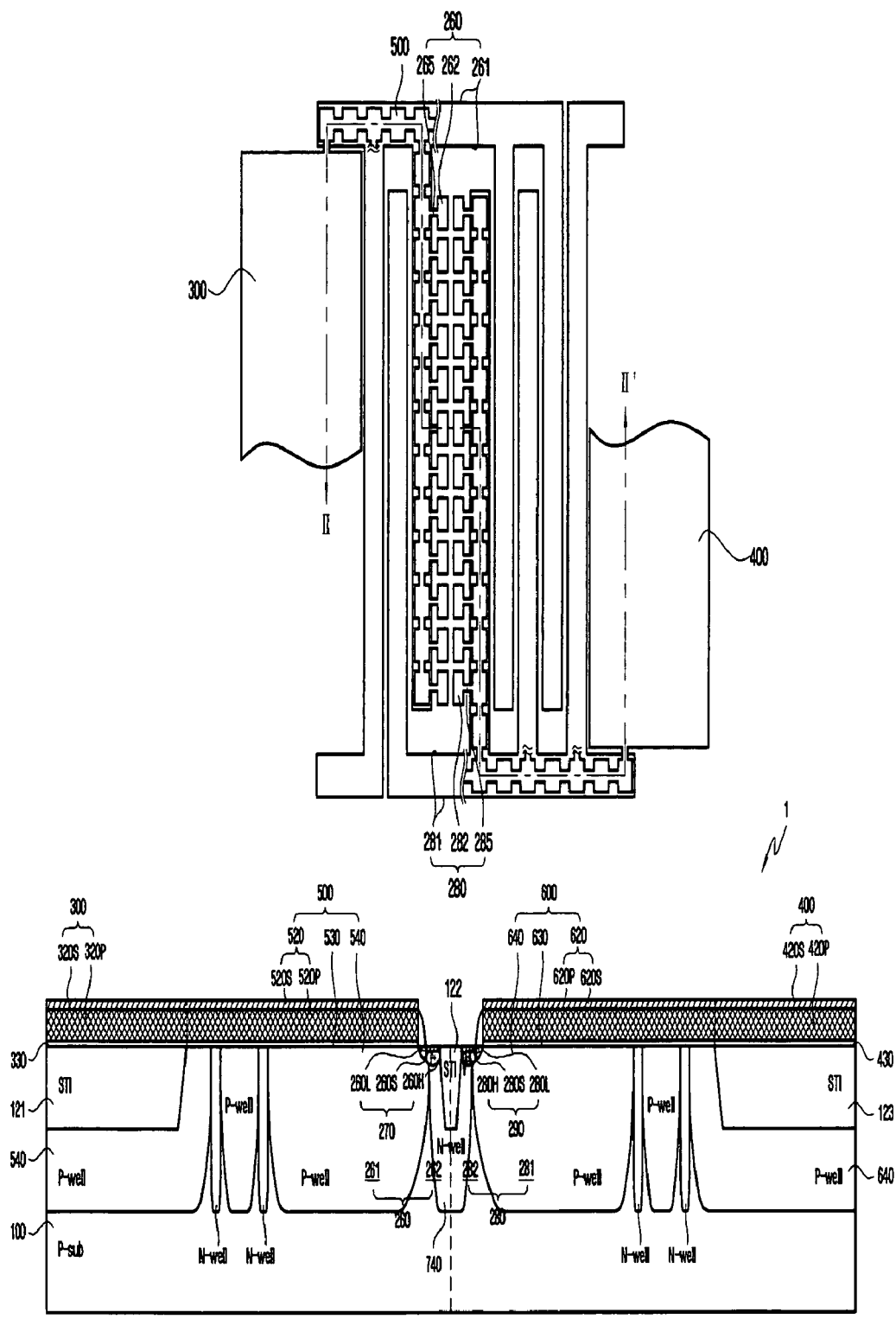
FIG. 2 together shows a cross-sectional view taken along a line II-II' of FIG. 1 and a layout diagram enlarging along the line II-II'.
Figure 3:
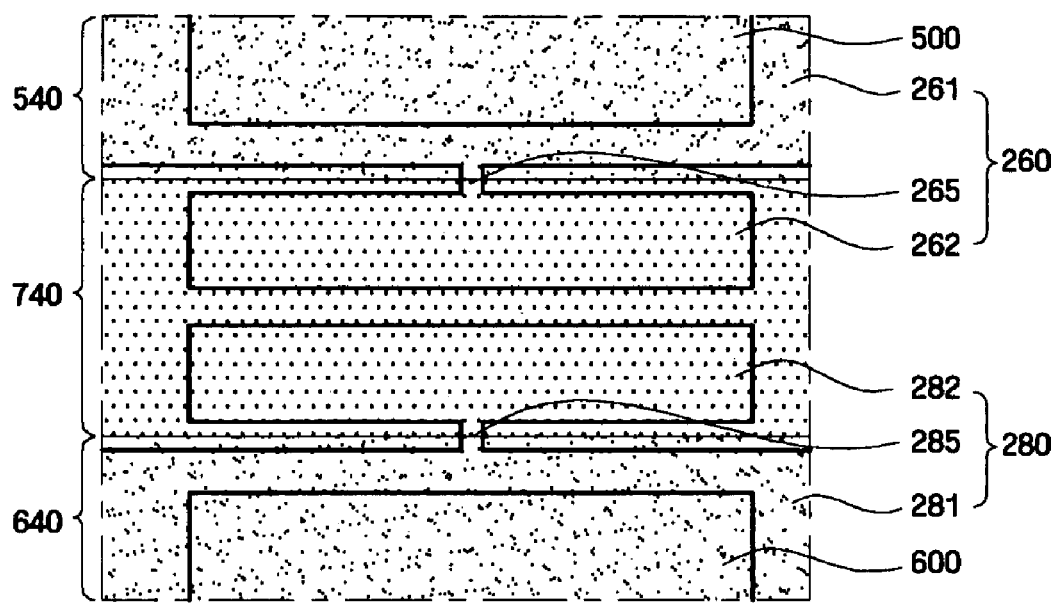
FIG. 3 is a partial layout diagram enlarging a region III of FIG. 1.

FIG. 1 is a layout diagram of a test structure of a semiconductor device according to one embodiment of the present invention, FIG. 2 together shows a cross-sectional view of the test structure, taken along a line II-II' shown in FIG. 1, and a layout diagram enlarged along the line II-II', and FIG. 3 is a partially enlarged layout diagram of a region III shown in FIG. 1. In FIG. 2, only first and second pads, first and second active regions, and connecting portions shown along the line II-II' are shown.

Referring to FIG. 1 through 3, a test structure 1 of a semiconductor device according to one embodiment of the present invention includes a semiconductor substrate 100, first and second active regions 260 and 280, a first pad 300, a second pad 400, a first connecting portion 500 and a second connecting portion 600.

The semiconductor substrate 100 may be formed of one or more semiconductor material selected from the group consisting of Si, Ge, SiGe, GaP, GaAs, SiC, SiGeC. InAs and InP. A p-type or n-type impurity doped substrate can be used as the semiconductor substrate 100.

A plurality of field isolation regions 121, 122 and 123 are formed within the semiconductor substrate 100 to define the active regions 260 and 280. The plurality of field isolation regions 121, 122 and 123 are generally field oxide (FOX) regions formed by local oxidation of silicon (LOCOS). Particularly, as shown in FIG. 2, the plurality of field isolation regions 121, 122 and 123 may be shallow trench isolation (STI) regions.

The first and second active regions 260 and 280 are electrically isolated from each other by the field isolation region 122. The first and second active regions 260 and 280 include first and second main active regions 261 and 281 arranged in a cross-finger array and a plurality of sub-active regions 200a, 200b, . . . , 200n branched off from the first and second main active regions 261 and 281 and facing and opposite to the first and second main active regions 261 and 281, the plurality of sub-active regions 200a, 200b, . . . , 200n being arranged between the first and second main active regions 261 and 281. Further, the plurality of sub-active regions 200a, 200b, . . . , 200n include first and second sub-active regions 262 and 282, respectively. The reasons for forming the plurality of first and second main active regions 261 and 281 in the cross-finger array will now be briefly described. First, the cross-finger array increases areas of the first and second connecting portions 500 and 600, thereby increasing the testing accuracy. Next, forming the plurality of the 200a, 200b, . . . , 200n makes it possible to perform a statistical analysis on the test structure 1 of the semiconductor device, thereby ultimately increasing the analysis accuracy, which will later be described in more detail.

First and second junction regions 270 and 290 are formed on the first and second active regions 260 and 280. The first and second junction regions 270 and 290 are formed by doping n-type or p-type impurities on the first and second active regions 260 and 280 according to the type of the test structure 1 of the semiconductor device which is to be formed. The first and second junction regions 270 and 290 shown in the drawing are p-type junction regions by way of example.

The first and second junction regions 270 and 290, as shown in FIG. 2, may include lightly doped drains 260L and 280L and heavily doped drains 260H and 280H. Further, the first and second junction regions 270 and 290 include silicide layers 260S and 280S. To test whether or not a junction leakage current occurs due to silicide spike, the silicide layers 260S and 280S are formed on upper parts of the first and second junction regions 270 and 290 formed on the first and second active regions 260 and 280. The silicide layers 260S and 280S may be formed of a refractory metal such as Co, Ni, Ti, Hf, or Pt.

An electrical signal can be applied to the silicided junction regions 270 and 290 and detected through the first and second pads 300 and 400. In one embodiment of the present invention, the first and second pads 300 and 400 are formed on the same level as a lower part of a metal layer, for example, a gate electrode (not shown). In addition, the first and second pads 300 and 400 may be formed on the field isolation regions 121 and 123. Accordingly, it is possible to prevent junction breakdown of active regions, which may occur when a predetermined electrical signal is applied to the first and second pads 300 and 400 and detected using a probe. Further, it is preferable that the first and second pads 300 and 400 are formed on the same level as the gate electrode 220 using the same material as the gate electrode (not shown). That is, the first and second pads 300 and 400 may include the polysilicon layers 320P and 420P and the silicide layers 320S and 420S which are sequentially formed on insulating layers 330 and 430.

The first and second connecting portions 500 and 600 connect the first and second pads 300 and 400 to the first and second junction regions 270 and 290, respectively. For example, the first and second connecting portions 500 and 600 are doped within the first and second main active regions 261 and 281. The first and second connecting portions 500 and 600 may have wells 540 and 640 of the same conductive type as the first and second junction regions 270 and 290, insulating layer 530 and 630 formed on the wells 540 and 640, and auxiliary pads 520 and 620 formed on the insulating layer 530 and 630, respectively. Further, to achieve integrity in connecting the first and second pads 300 and 400 to the first and second junction regions 270 and 290, the wells 540 and 640 may also be formed on lower parts of the first and second pads 300 and 400. For example, the plurality of wells 540 and 640 may be formed in multiple stripes arranged along the first and second main active regions 261 and 281.

Meanwhile, if the first and second junction regions 270 and 290 have the same conductive type as the semiconductor substrate 100, a well 740 having a conductive type different from the first and second junction regions 270 and 290 may be formed under the first and second sub-active regions 262 and 282. Conversely, if the first and second junction regions 270 and 290 have a conductive type different from the semiconductor substrate 100, the well 740 may not form.

Here, the first and second pads 300 and 400 forming the first and second connecting portions 500 and 600 are preferably formed on the same level as a gate electrode of the semiconductor device using the same material as the gate electrode. That is, the auxiliary pads 520 and 620 may include the polysilicon layers 520P and 620P and the silicide layers 520S and 620S which are sequentially formed on the insulating layer 530 and 630, respectively.

In addition, the first and second connecting portions 500 and 600 may be arranged in a cross-finger array on the first and second main active regions 261 and 281 arranged in a cross-finger array.

Meanwhile, since the wells 540 and 640 have the same conductivity type as the first and second junction regions 270 and 290 that are formed on lower parts of the first and second main active regions 261 and 281, and the well 740 having the opposite conductivity type to the wells 540 and 640 is formed under the first and second sub-active regions 262 and 282, a leakage current may occur at interfaces therebetween. Therefore, the first and second main active regions 261 and 281 and the first and second sub-active regions 262 and 282 can be connected by contact active regions 265 and 285 having as narrow a width as possible. To minimize the amount of leakage current, the contact active regions 265 and 285 are formed to have a width having the margin resolution of a photolithography process.

Hereinafter, an operation of the test structure 1 of the semiconductor device according to one embodiment of the present invention will be described with reference to FIGS. 1, 4 and 5.

To detect occurrence of silicide spike, a junction leakage current is measured, which will be described with reference to FIG. 4. The semiconductor substrate 100 is connected to a ground voltage GND, the first pad 300 is connected to the ground voltage GND or to a negative voltage FORCE (−), and the second pad 400 is connected to the negative voltage FORCE (−). Here, a current path is formed by the second pad 400, the second connecting portion 600, the second junction region 290, the well 740, the first connecting portion 500 and the first pad 300. That is, the main current path is formed in an arrow direction indicated by b→a.

The current path (a) will first be described.

In one embodiment of the present invention, the first and second junction regions 270 and 290 include the silicide layers 260S and 280S, respectively. If a silicide spike does not occur at the silicide layers 260S and 280S, a ground voltage GND is applied to the semiconductor substrate 100 and the first pad 300 and a negative voltage FORCE (−) is applied to the second pad 400. As a result, a reverse bias is applied to the second junction region 290 and the well 740 disposed below the second junction region 290, so that the current path (a) is not formed. Thus, the amount of the leakage current generated thereat is negligibly small.

Figure 4:
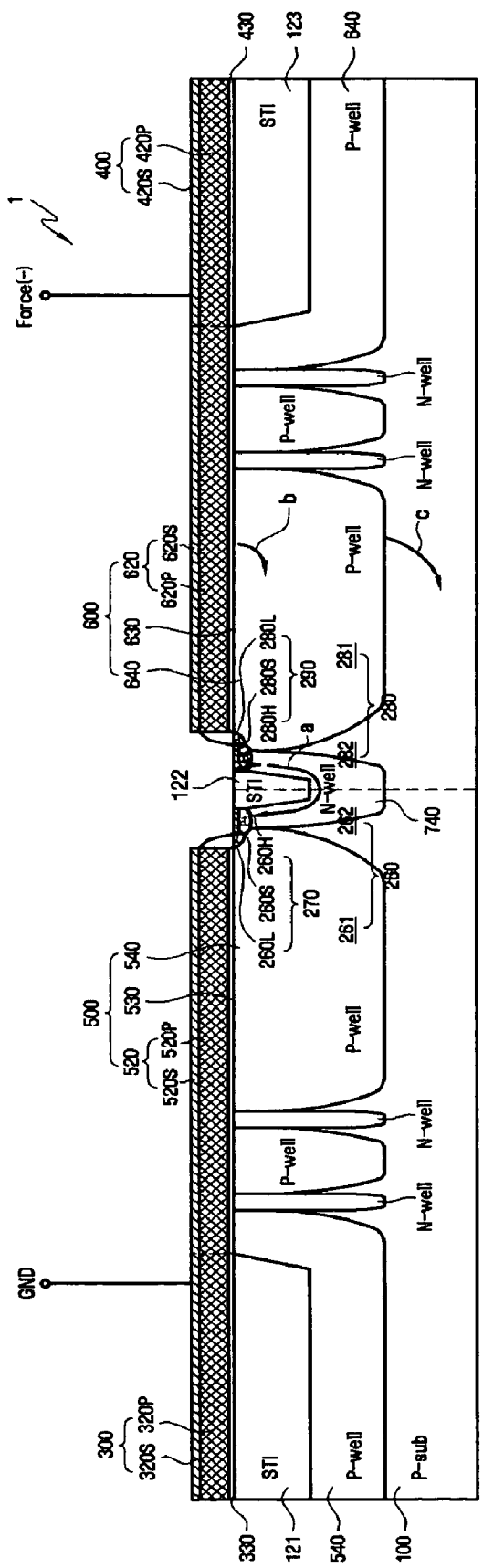
FIG. 4 illustrates a cross-sectional view taken along the line II-II' of FIG. 1 and a current path.

If a silicide spike occurs at the silicide layer 280S, as shown in FIG. 4, the silicide spike penetrates into an impurity doped area of the second junction region 290 to reach the well 740 having the opposite conductivity type to the second junction region 290, resulting in a junction breakdown. If the silicide spike occurs at the silicide layer 280S electrically connected to a negative voltage FORCE (−) of about −1.0V, the negative voltage FORCE (−) of about −1.0V is applied to the well 740. As a result, a forward diode is turned on between the well 740 and the first junction region 270 connected to the ground voltage GND, so that a current flows in an arrow direction indicated by the current path (a). Thus, the amount of the junction leakage current is much larger than that of the normal state.

As to current path (b), a current passes through the insulating layers 530 and 630 of the first and second connecting portions 500 and 600 using a Fowler-Nordheim (FN) tunneling phenomenon.

With regard to current path (c), since the wells 540 and 640 having the same conductivity type as the first and second junction regions 270 and 290 are formed on the lower parts of the first and second main active regions 261 and 281, and the well 740 of the conductivity type opposite to the wells 540 and 640 is formed on the lower parts of the first and second sub-active regions 262 and 282, a leakage current may occur at interfaces therebetween.

When the current paths (a), (b) and (c) are taken into consideration, an electrical signal detected in testing the occurrence of silicide spike must be determined by the current path (a). Accordingly, resistance of the first and second connecting portions 500 and 600 that affects the amount of current flowing through the current path (b) must be controlled to be sufficiently smaller than the resistance of a part where the current path (a) is formed. To decrease the resistance, the overall area of the first and second connecting portions 500 and 600 is made sufficiently large. Preferably, the first and second connecting portions 500 and 600 are arranged in a cross-finger array along the first and second main active regions 261 and 281. In addition, the resistance of the current path (c) connected in parallel to the resistance of the current path (a) should be made large so that the amount of the current of the current path (c) is small or negligible. Accordingly, the first and second main active regions 261 and 281 and the first and second sub-active regions 262 and 282 are connected by contact active regions 265 and 285 having as narrow a width as possible. Preferably, the contact active regions 265 and 285 are formed to have a width having the margin resolution of a photolithography process.

The test structure 1 of the semiconductor device according to one embodiment of the present invention is completed by performing a silicide formation process. According to an embodiment of the present invention, the semiconductor device can be tested immediately after performing the silicide formation process without performing an additional metallization process. Thus, it is possible to clearly identify whether or not a failure of the semiconductor device is caused by lateral encroachment generated during the silicide formation process. Further, a probe to which a voltage for the test is applied can be placed on a shallow trench isolation (STI) region, and the semiconductor device is not damaged by the probe. Since testing is conducted on the semiconductor device including the plurality of first and second sub-active regions, a probability of occurrence of silicide spike can also be statistically analyzed. Moreover, the silicide spike of the silicide layer can be determined immediately after performing the silicide formation process, at an initial stage of a semiconductor device integration process. If a failure is detected, it is not necessary to perform processes subsequent to the silicide formation process on the defective semiconductor device, thereby reducing the process cost.

Figure 5:
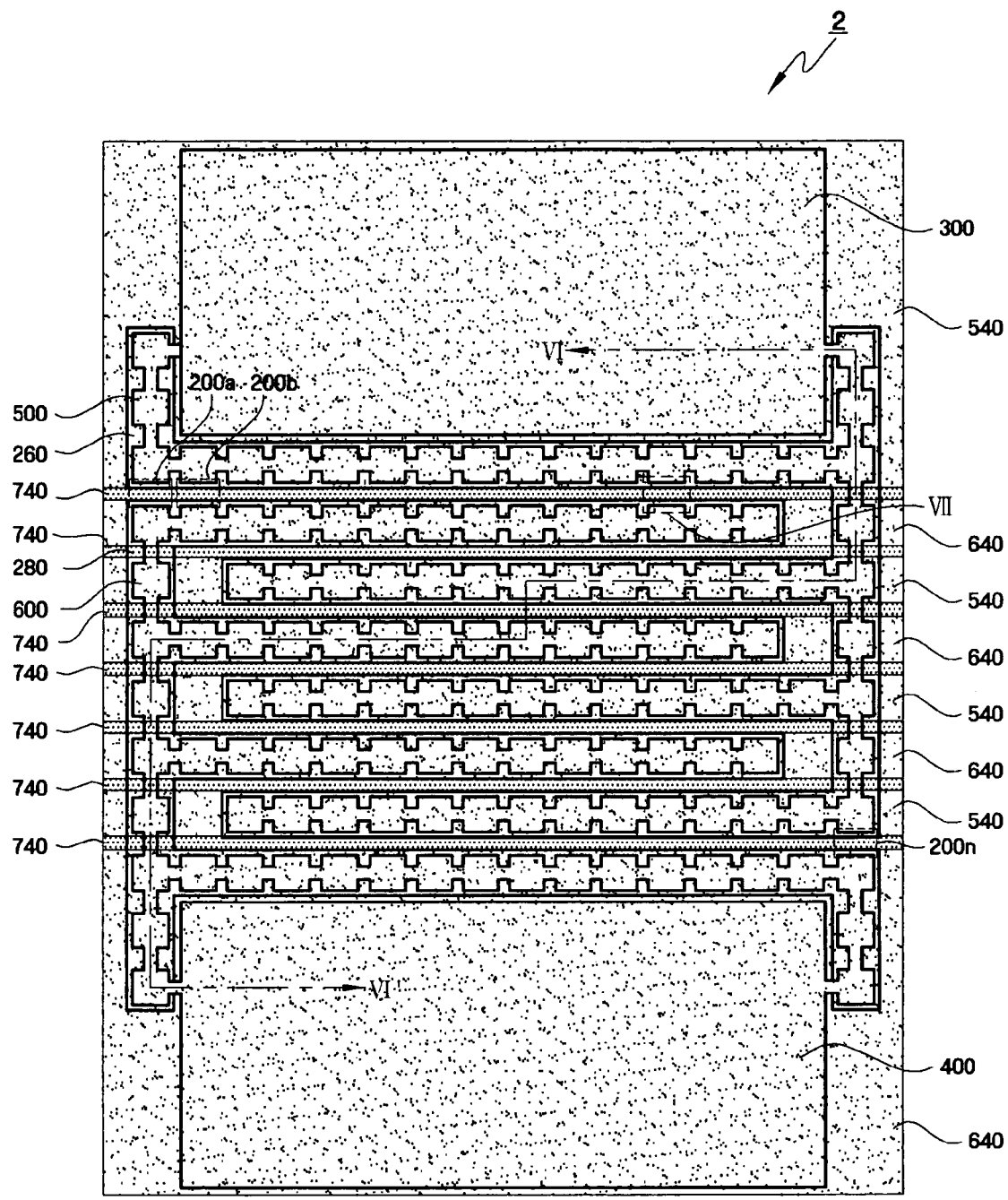
FIG. 5 is a layout diagram of a test structure of a semiconductor device according to another embodiment of the present invention.
Figure 6:
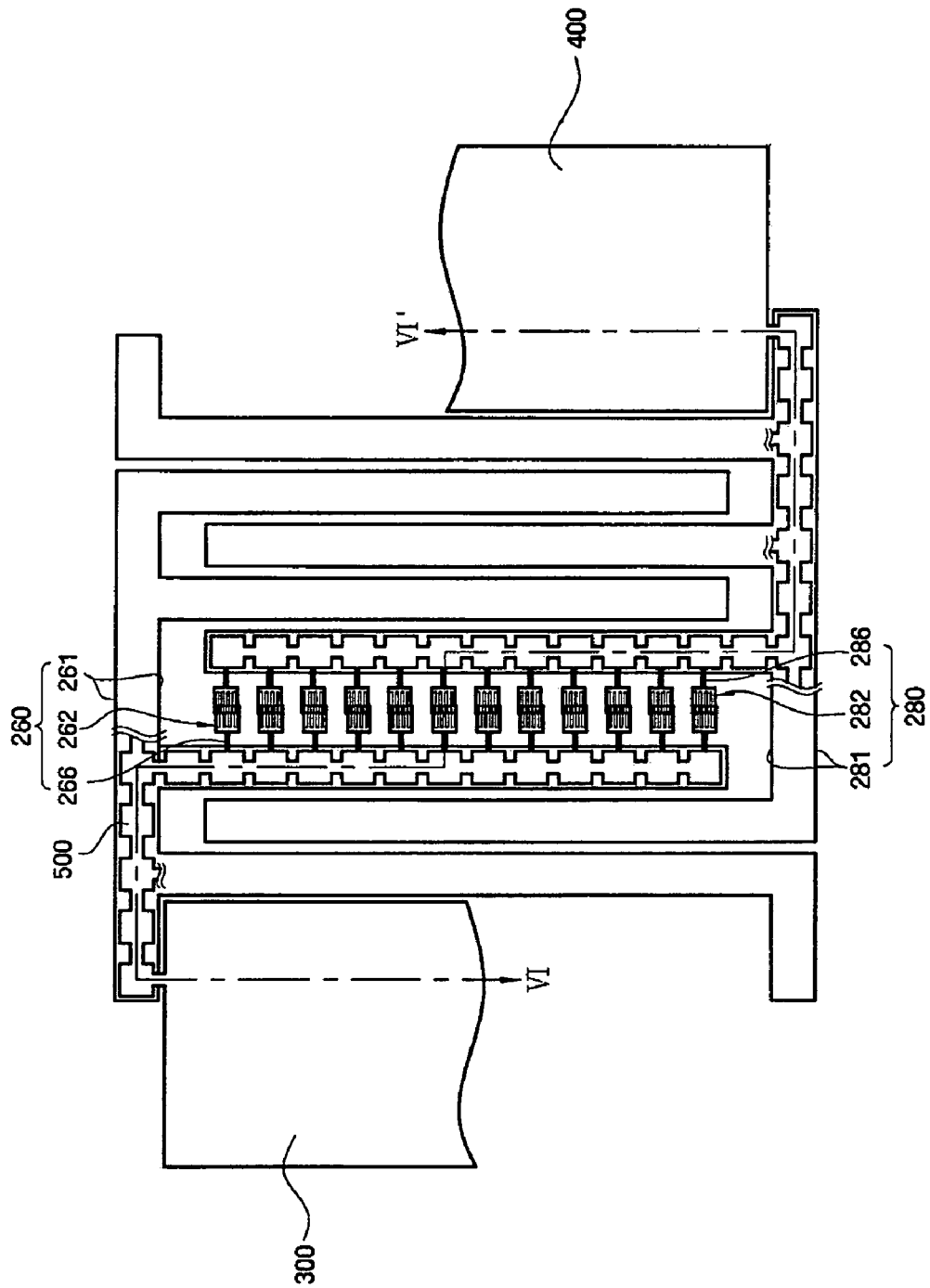
FIG. 6 is a layout diagram enlarging along a line VI-VI' of FIG. 5.
Figure 7:
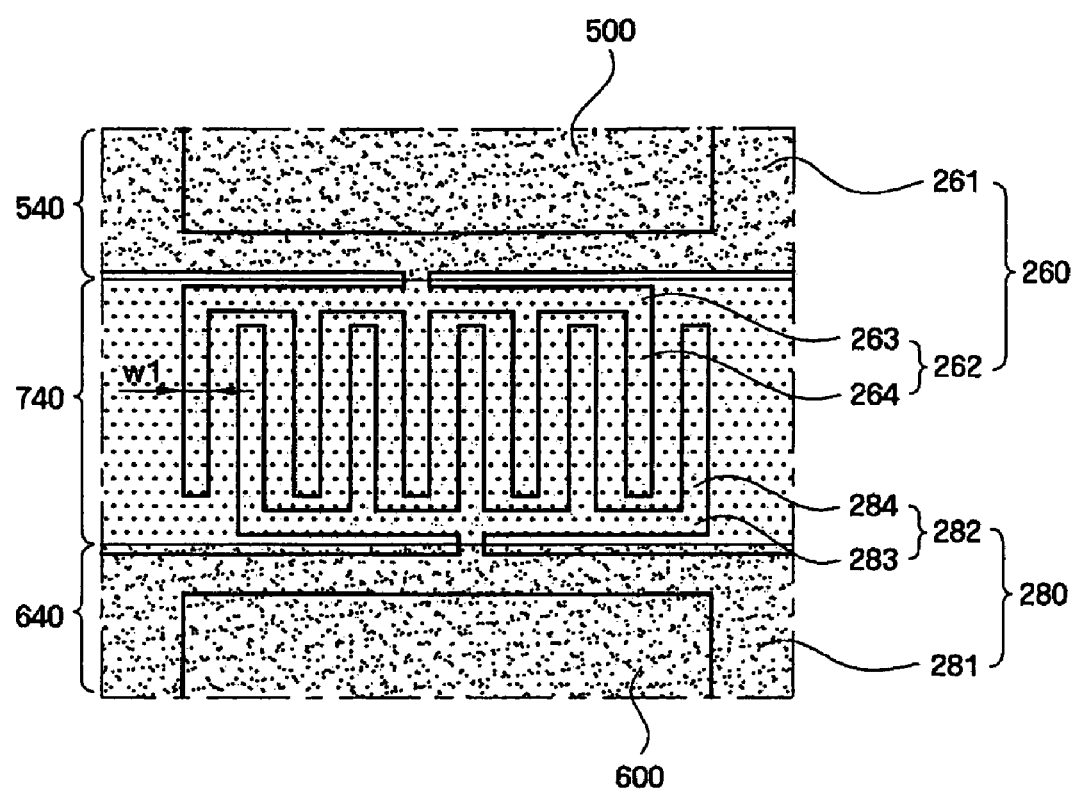
FIG. 7 is a partial layout diagram enlarging a region VII of FIG. 5.

FIG. 5 is a layout diagram of a test structure of a semiconductor device according to another embodiment of the present invention, FIG. 6 is a layout diagram enlarged along a line VI-VI' shown in FIG. 5, and FIG. 7 is a partially enlarged layout diagram of a region VII shown in FIG. 5. In FIG. 6, only first and second pads, first and second active regions, and connecting portions shown along the line VI-VI' are shown. A well is not shown. Structures and components identical or equivalent to those described in one embodiment are designated by the same reference numerals, and descriptions thereof will not be given.

Referring to FIGS. 5 through 7, a test structure 2 of a semiconductor device according to another embodiment of the present invention is substantially the same as the test structure 1 of the semiconductor device according to the previous embodiment of the present invention, except the sub-active regions are further branched off into a plurality of branch sub-active regions, so that the number of sub-active regions per unit area is maximized. This is found to have improved sensitivity in the test.

Specifically, the first and second active regions 260 and 280 include first and second main active regions 261 and 281 arranged in a cross-finger array and a plurality of sub-active regions 200a, 200b, . . . , 200n branched off from and opposite to the first and second main active regions 261 and 281, respectively, the plurality of sub-active regions 200a, 200b, . . . , 200n being arranged between each of the first and second main active regions 261 and 281, respectively. The plurality of sub-active regions 200a, 200b, . . . , 200n include first and second sub-active regions 262 and 282, respectively.

Here, the first and second sub-active regions 262 and 282 include first and second common sub-active regions 263 and 283 and a plurality of first and second branch sub-active regions 264 and 284 branched off from the first and second common sub-active regions 263 and 283, respectively. By branching off the first and second sub-active regions 262 and 282 into the plurality of first and second branch sub-active regions 264 and 284 in such a manner, the number of sub-active regions per unit area can be maximized. Thus, a width w1 of the sub-active regions can be set to have the width having the margin resolution of a photolithography process. In addition, the first and second branch sub-active regions 264 and 284 may be arranged in a cross-finger array.

Since wells (refer to 540 and 640 shown in FIGS. 1 through 4) have the same conductivity type as the semiconductor substrate 100 are formed on lower parts of the first and second main active regions 261 and 281, and a well (refer to 740 shown in FIGS. 1 through 4) having the opposite conductivity type to the semiconductor substrate 100 is formed under the first and second sub-active regions 262 and 282, a leakage current may occur. Therefore, the first and second main active regions 261 and 281 and the first and second sub-active regions 262 and 282 can be connected by contact active regions 265 and 285 having as narrow a width as possible.

In the test structure 2 of the semiconductor device according to another embodiment of the present invention, the sensitivity of the test can be improved by forming as many sub-active regions as possible in a smaller area.

Hereinafter, a test structure of a semiconductor device including first and second pads formed on the same level as a semiconductor substrate is described with reference to FIGS. 8 through 13.

Figure 8:
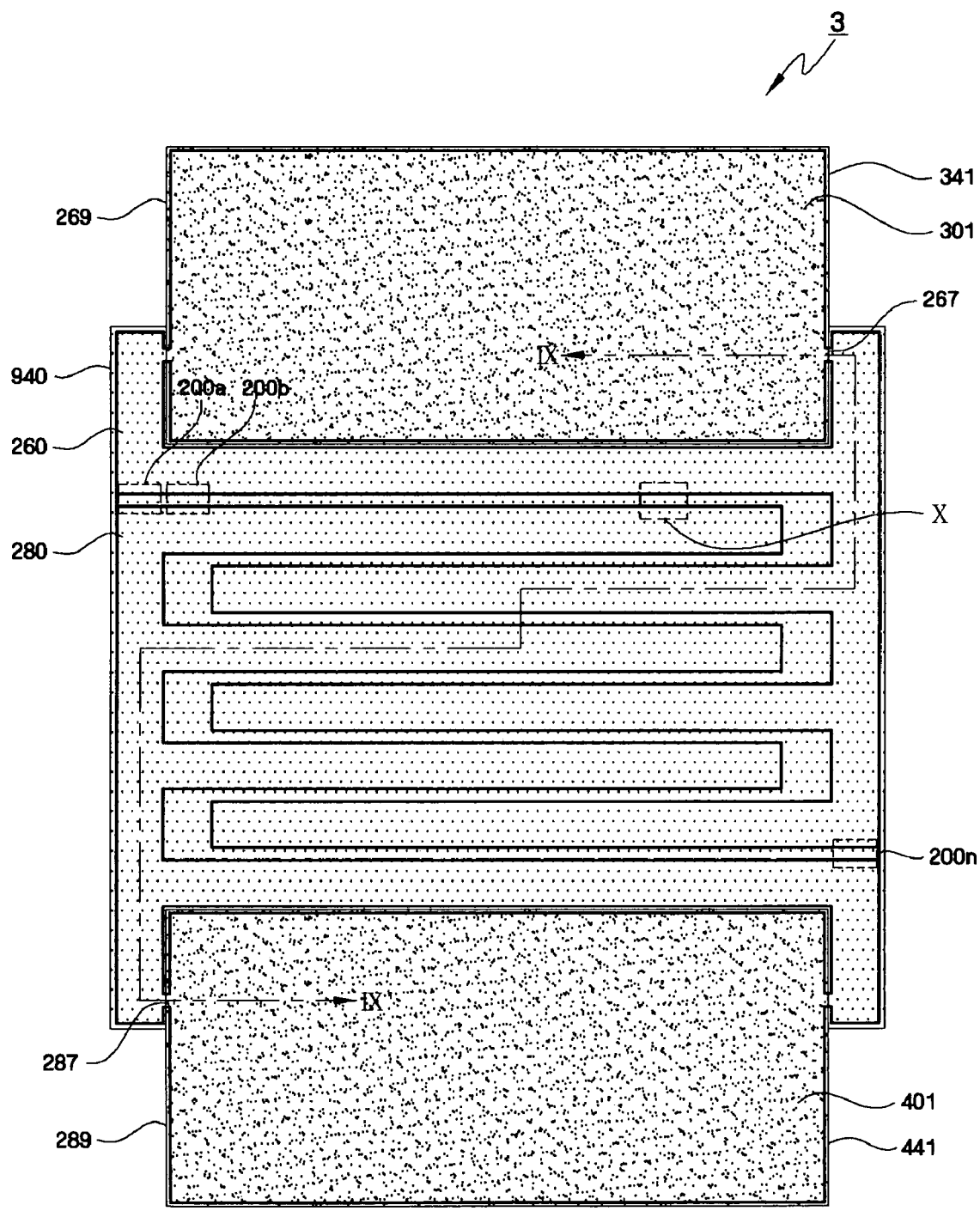
FIG. 8 is a layout diagram of a test structure of a semiconductor device according to still another embodiment of the present invention.
Figure 9:
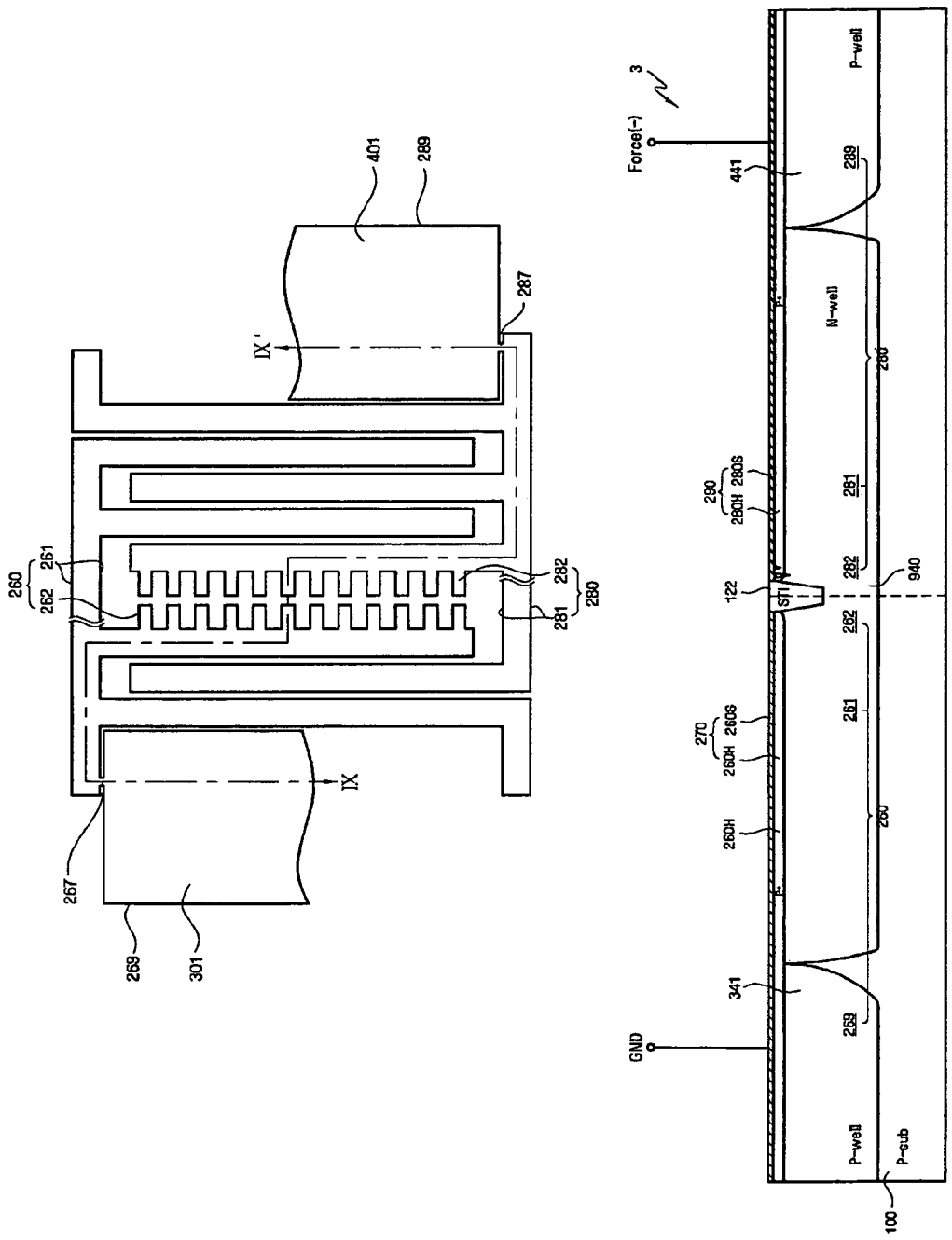
FIG. 9 together shows a cross-sectional view taken along a line IX-IX' of FIG. 8 and a layout diagram enlarging along the line IX-IX'.
Figure 10:
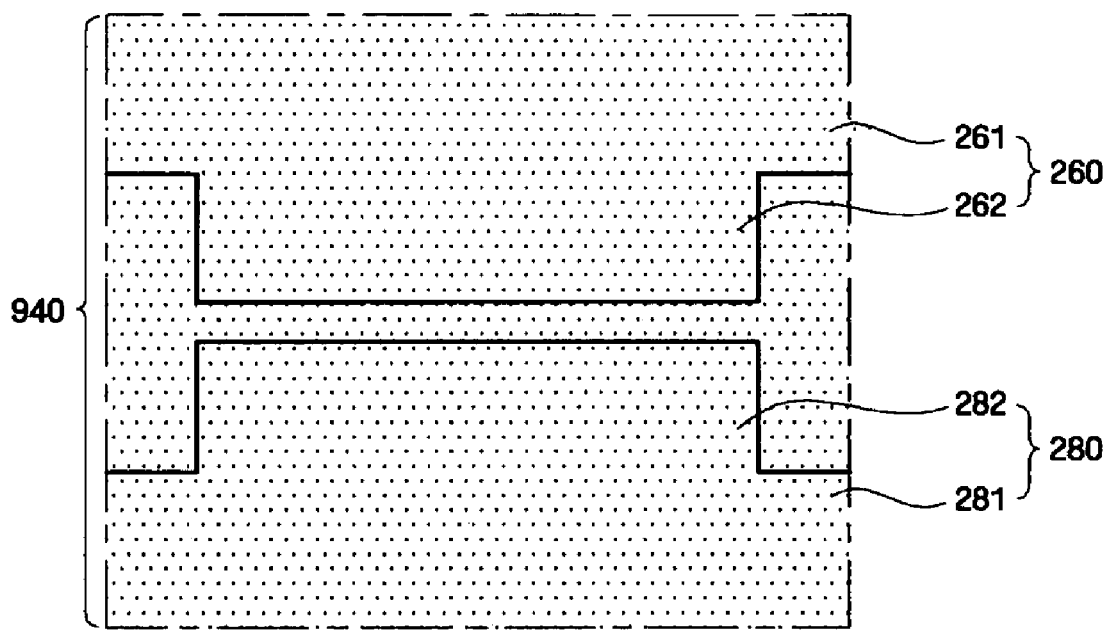
FIG. 10 is a partial layout diagram enlarging a region X of FIG. 8.

FIG. 8 is a layout diagram of a test structure of a semiconductor device according to still another embodiment of the present invention. FIG. 9 shows a cross-sectional view taken along a line IX-IX' shown in FIG. 8 and an enlarged layout diagram along the line IX-IX', and FIG. 10 is a partially enlarged layout diagram of a region X shown in FIG. 8. In FIG. 10, only first and second pads, first and second active regions, and connecting portions shown along the line IX-IX' are shown. A well is not shown. Structures and components identical or equivalent to those described in the above-described embodiment are designated by the same reference numerals, and descriptions thereof will not be given.

Referring to FIGS. 8 through 10, a test structure 3 of a semiconductor device according to still another embodiment of the present invention includes a semiconductor substrate 100, first and second active regions 260 and 280, a first pad 301 and a second pad 401.

Silicided first and second junction regions 270 and 290 and the first and second pads 301 and 401 are formed on the first and second active regions 260 and 280. The first and second active regions 260 and 280 are defined by a field isolation region 122 formed within the semiconductor substrate 100. The first and second active regions 260 and 280 include first and second main active regions 261 and 281 arranged in a cross-finger array and a plurality of sub-active regions 200a, 200b, ..., 200n branched off from and opposite to the first and second main active regions 261 and 281, and first and second pad active regions 269 and 289 where first and second pads 301 and 401 are formed, respectively, the plurality of sub-active regions 200a, 200b, ..., 200n being arranged between each of the first and second main active regions 261 and 281. The plurality of sub-active regions 200a, 200b, ..., 200n include first and second sub-active regions 262 and 282, respectively.

The first and second junction regions 270 and 290 are formed by doping n-type or p-type impurities on the first and second active regions 260 and 280 according to the type of the test structure 3 of the semiconductor device which is to be formed. The first and second junction regions 270 and 290 may include heavily doped drains 260H and 280H. Further, the first and second junction regions 270 and 290 include silicide layers 260S and 280S. That is, to detect occurrence of a silicide spike, the silicide layers 260S and 280S are formed on upper parts of the first and second junction regions 270 and 290.

The first and second pads 301 and 401 are well pads comprised of wells 341 and 441 formed on the lower parts of the first and second pad active regions 269 and 289. That is, the first and second pads 301 and 401 are formed on the same level as the semiconductor substrate 100. The first and second pads 301 and 401 are wells formed of a material having the same conductivity type as the first and second junction regions 270 and 290. Accordingly, in a case where the first and second junction regions 270 and 290 are formed by doping n-type impurities, the wells 341 and 441 constituting the first and second pads 301 and 401 are also formed by doping n-type impurities. Accordingly, although a probe is placed on the first and second pads 301 and 401, junction breakdown does not occur.

Meanwhile, if the semiconductor substrate 100 has the same conductivity type as the first and second junction regions 270 and 290, a well 940 having a conductivity type different from the first and second junction regions 270 and 290 may be formed under the first and second sub-active regions 262 and 282, respectively.

In addition, since the first and second pads 301 and 401 are not formed on the field isolation region 122 but are formed by the wells 341 and 441 under first and second junction regions 270 and 290, the wells 341 and 441 having the same conductivity type as the first and second junction regions 270 and 290, it is not necessary to provide additional first and second connecting portions (500 and 600 shown in FIG. 2) to connect the first and second pads 301 and 401 to the first and second junction regions 270 and 290.

Meanwhile, since wells 341 and 441 disposed on the lower parts of the first and second pad active regions 269 and 289 have a conductivity type different from the well 940 disposed on the lower parts of the first and second main active regions 261 and 281, a leakage current may occur. Accordingly, it is preferable to reduce the contact areas of contact active regions 267 and 287 connecting the first and second pad active regions 269 and 289 to the first and second main active regions 261 and 281. The widths of the contact active regions 267 and 287 may have the width having the margin resolution of a photolithography process.

As opposed to the embodiment shown above in FIGS. 1 through 4, according to this embodiment, it is not necessary to separately form contact active regions (265 and 285 shown in FIG. 2) between each of the first and second main active regions 261 and 281 and each of the first and second sub-active regions 262 and 282. This is because the well 940 having the same conductivity type as the first and second main active regions 261 and 281 and the first and second sub-active regions 262 and 282 is formed on the lower parts thereof, so that a leakage current is not generated at interfaces therebetween.

In the test structure 3 of the semiconductor device according to still another embodiment of the present invention, no conductive polysilicon layer is formed on the field isolation region 122, like in the test structure 1 shown in FIG. 1. Thus, the test structure 3 of the semiconductor device can be fabricated through a minimum number of processing steps.

Figure 11:
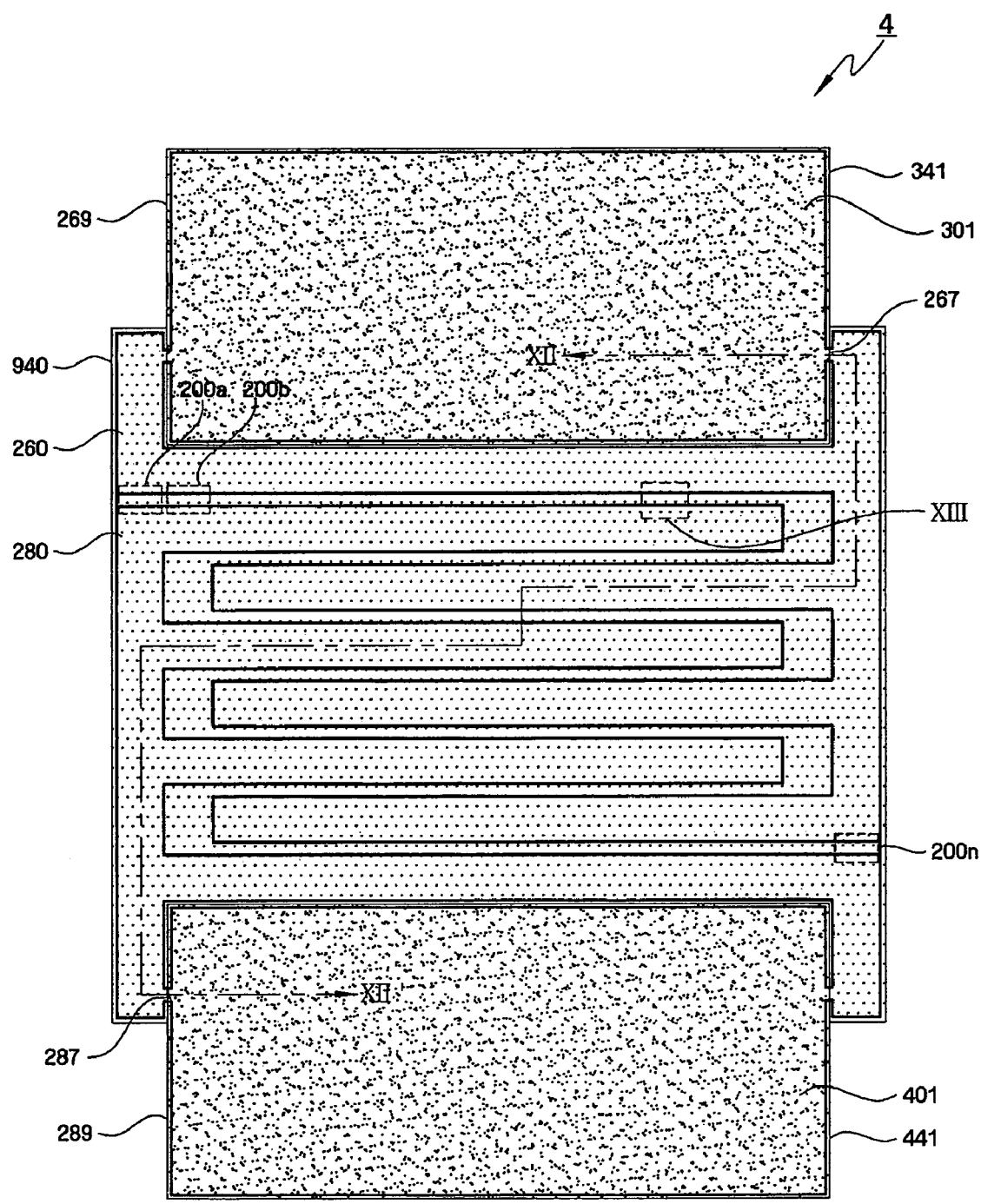
FIG. 11 is a layout diagram of a test structure of a semiconductor device according to another embodiment of the present invention.
Figure 12:
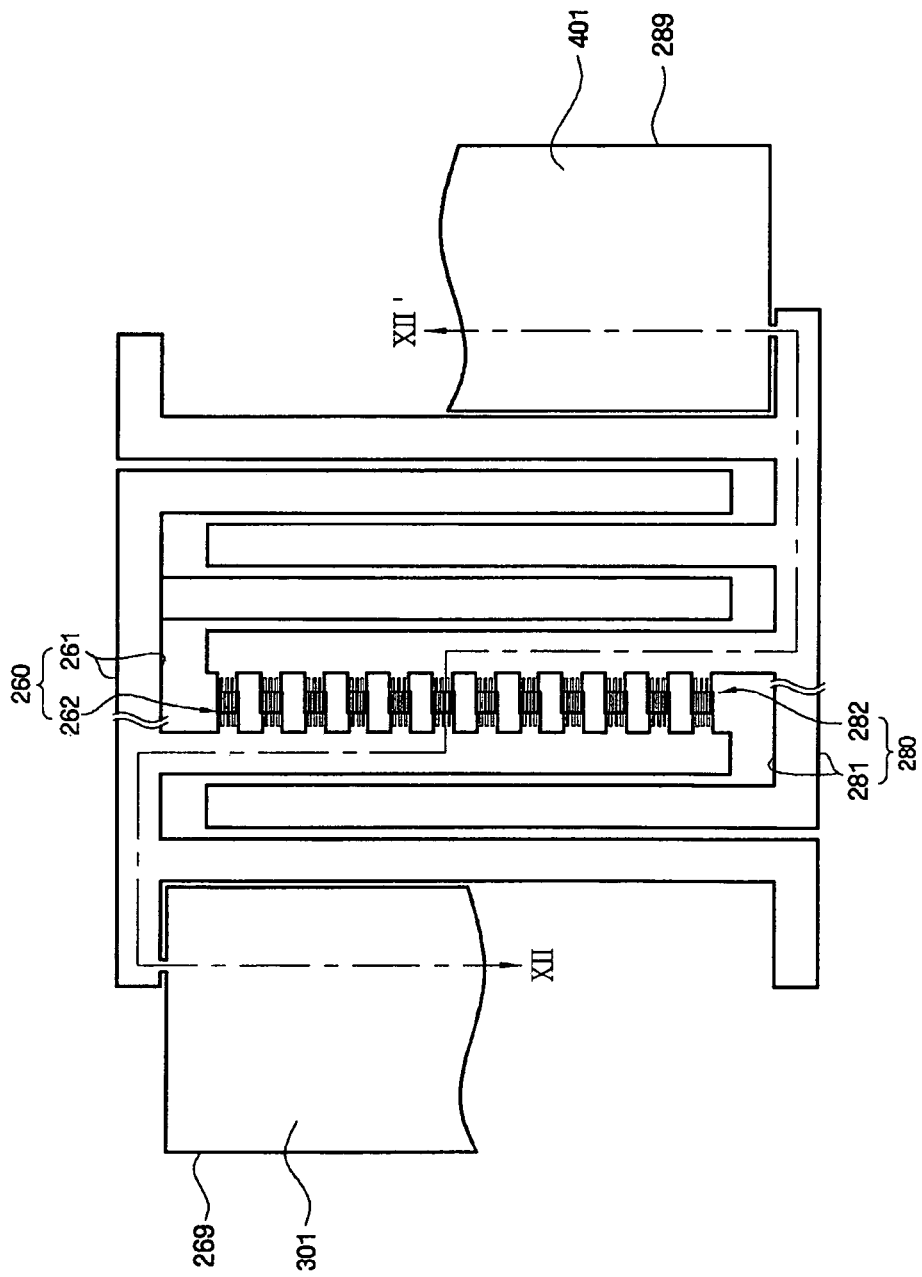
FIG. 12 is a layout diagram enlarging along a line XII-XII' of FIG. 11.
Figure 13:
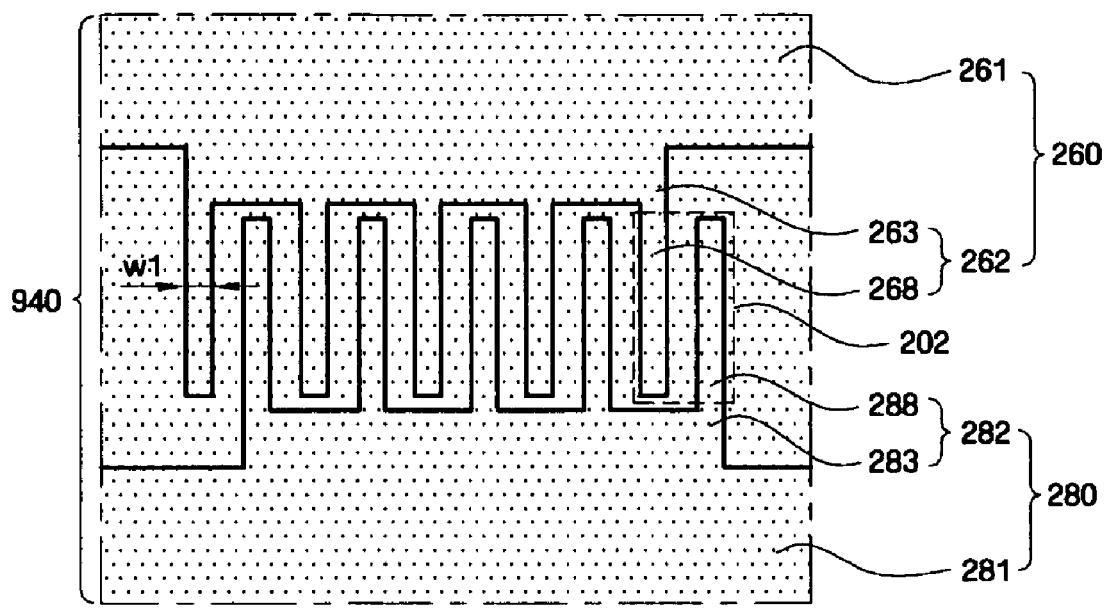
FIG. 13 is a partial layout diagram enlarging a region XIII of FIG. 11.

FIG. 11 is a layout diagram of a test structure of a semiconductor device according to a further embodiment of the present invention, FIG. 12 is a layout diagram enlarged along a line XII-XII' shown in FIG. 11, and FIG. 13 is a partially enlarged layout diagram of a region XIII shown in FIG. 11. In FIG. 12, only first and second pads, first and second active regions, and connecting portions shown along the line XII-XII' are shown. A well is not shown. Structures and components identical or equivalent to those described in the above-described embodiment are designated by the same reference numerals, and descriptions thereof will not be given.

Referring to FIGS. 11 through 13, in a test structure 4 of a semiconductor device according to the illustrative embodiment of the present invention, the number of sub-active regions per unit area is maximized by further branching off each of the sub-active regions into a plurality of branch sub-active regions, thereby increasing the sensitivity of the test.

Specifically, the first and second active regions 260 and 280 include first and second main active regions 261 and 281 arranged in a cross-finger array and a plurality of sub-active regions 200a, 200b, ..., 200n branched off from and opposite to the first and second main active regions 261 and 281, respectively, the plurality of sub-active regions 200a, 200b, ..., 200n being arranged between each of the first and second main active regions 261 and 281, respectively. The plurality of sub-active regions 200a, 200b, ..., 200n include first and second sub-active regions 262 and 282, respectively. Here, the first and second sub-active regions 262 and 282 include first and second common sub-active regions 263 and 283 and a plurality of first and second branch sub-active regions 268 and 288 branched off from the first and second common sub-active regions 263 and 283, respectively. By branching off the first and second sub-active regions 262 and 282 into the plurality of first and second branch sub-active regions 268 and 288 in such a manner, the number of sub-active regions per unit area can be maximized. Thus, a width w1 of the sub-active regions can be set to have the width having the margin resolution of a photolithography process. In addition, the first and second sub-active regions 262 and 282 may be arranged in a cross-finger array.

The first and second main active regions 261 and 281 and the first and second pad active regions 269 and 289 can be connected by contact active regions 267 and 287 having a narrow width, preferably as narrow a width as possible. The contact active regions 267 and 287 are preferably formed to have a width having the margin resolution of a photolithography process. This is because the wells 341 and 441 disposed on the lower parts of the first and second pad active regions 269 and 289 have the same conductivity type as the well 940 disposed on the lower parts of the first and second main active regions 261 and 281, resulting in a leakage current.

The test structure 4 of the semiconductor device according to a further embodiment of the present invention can improve the sensitivity of the test by forming as many sub-active regions, preferably as many as possible in a smaller area.

The test structure of the semiconductor device according to the embodiments of the present invention provides at least the following:

First, occurrence of a silicide spike can be tested after performing a silicide formation process without a separate metallization process, thereby reducing the fabrication cost.

Second, whether the failure is caused by the metallization process or the silicide formation process can be identified.

Those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A test structure of a semiconductor device comprising:
   first and second active regions which are electrically isolated from each other by a first field isolation region and on which silicided first and second junction regions are formed, respectively;
   a semiconductor substrate which has a same conductivity type as the silicided first and second junction regions;
   a well which is formed on lower parts of the silicided first and second junction regions and has a conductivity type different from the silicided first and second junction regions, and surrounds the first field isolation region; and
   first and second pads electrically connected respectively to the silicided first and second junction regions for receiving an application of an electrical signal and outputting a detected signal, wherein the first and second pads are formed on the same level as a lower part of a metal layer or on the same level as the semiconductor substrate.

2. The test structure of claim 1, wherein the first and second pads formed on the same level as the lower part of the metal layer is an interconnect layer formed on a second field isolation region of the semiconductor substrate.

3. The test structure of claim 2, further comprising a first connecting portion which is formed on the first active region and connects the first pad to the silicided first junction region; and a second connecting portion which is formed on the second active region and connects the second pad to the silicided second junction region.

4. The test structure of claim 3, wherein the first and second connecting portions include wells having the same conductivity type as the silicided first and second junction regions, insulating layers formed on the wells, and auxiliary pads electrically connected to the first and second pads.

5. The test structure of claim 1, wherein the first and second pads are formed on the same level as the semiconductor substrate and are well pads which are formed on a portion of the lower parts of the silicided first and second junction regions and have the same conductivity type as the silicided first and second junction regions.

6. The test structure of claim 1, wherein the first and second pads are well pads, and wherein first and second pad active regions respectively included in the first and second active regions having the well pads formed thereon are connected to regions other than the first and second pad active regions of the first and second active regions through contact active regions that have a width having the margin resolution of a photolithography process.

7. The test structure of claim 1, wherein the first and second active regions are arranged in a cross-finger array.

8. The test structure of claim 1, wherein the first pad is connected to a ground voltage or a negative voltage and the second pad is connected to the negative voltage.

9. A test structure of a semiconductor device comprising:
   first and second active regions which are electrically isolated from each other by a first field isolation region and on which silicided first and second junction regions are formed, respectively;
   a semiconductor substrate which has a same conductivity type as the silicided first and second junction regions;
   a well which is formed on lower parts of the silicided first and second junction regions and has a conductivity type different from the silicided first and second junction regions, and surrounds the first field isolation region;

first and second pads which are formed on the semiconductor substrate and the same level as a lower part of a metal layer; and first and second connecting portions which connect the first and second pads to the silicided first and second junction regions, respectively.

10. The test structure of claim 9, wherein the first and second pads are formed on a second field isolation region defining the first and second active regions.

11. The test structure of claim 9, wherein the first and second connecting portions include wells having the same conductivity type as the silicided first and second junction regions, insulating layers formed on the wells, and auxiliary pads electrically connected to the first and second pads, respectively.

12. The test structure of claim 9, wherein the first and second active regions include first and second main active regions arranged in a cross-finger array and a plurality of first and second sub-active regions which are branched off from the first and second main active regions, respectively, and wherein the first and second connecting portions are arranged on the first and second main active regions in a cross-finger array.

13. The test structure of claim 12, wherein the first and second sub-active regions are connected to the first and second main active regions through contact portions that have a width having the margin resolution of a photolithography process.

14. The test structure of claim 12, wherein the first and second sub-active regions include first and second common sub-active regions and a plurality of first and second branch sub-active regions which are branched off from the first and second common sub-active regions, respectively.

15. The test structure of claim 14, wherein the first and second branch sub-active regions have widths having the margin resolution of a photolithography process.

16. The test structure of claim 14, wherein the first and second branch sub-active regions are formed in a cross-finger array.

17. The test structure of claim 9, wherein the first pad is connected to a ground voltage or a negative voltage and the second pad is connected to a negative voltage.

18. A test structure of a semiconductor device comprising:
first and second active regions which are electrically isolated from each other by a first field isolation region and in which silicided first and second junction regions are formed, respectively;

a semiconductor substrate which has a same conductivity type as the silicided first and second junction regions;

a well which electrically connects lower parts of the silicided first and second junction regions to each other and has a conductivity type different from the silicided first and second junction regions, and surrounds the first field isolation region; and first and second well pads which are formed on a portion of the lower parts of the silicided first and second junction regions and have the same conductivity type as the silicided first and second junction regions.

19. The test structure of claim 18, wherein first and second pad active regions respectively included in the first and second active regions having the first and second well pads formed thereon are connected to regions other than the first and second pad active regions of the first and second active regions through contact active regions that have a width having the margin resolution of a photolithography process.

20. The test structure of claim 18, wherein the first and second active regions include first and second main active regions arranged in a cross-finger array and a plurality of first and second sub-active regions which are connected to the first and second main active regions to face and opposite to the same, the first and second sub-active regions being arranged between each of the first and second main active regions.

21. The test structure of claim 20, wherein the first and second sub-active regions include first and second common sub-active regions and a plurality of first and second branch sub-active regions which are branched off from the first and second common sub-active regions, respectively.

22. The test structure of claim 21, wherein the first and second branch sub-active regions have widths having the margin resolution of a photolithography process.

23. The test structure of claim 21, wherein the first and second branch sub-active regions are formed in a cross-finger array.

24. The test structure of claim 18, wherein the first well pad is connected to a ground voltage or a negative voltage and the second well pad is connected to the negative voltage.

* * * * *